United States Patent [19]

Rouy

[11] Patent Number: 5,473,496
[45] Date of Patent: Dec. 5, 1995

[54] DEVICE FOR THE PROTECTION OF AN INTEGRATED CIRCUIT AGAINST POWER SUPPLY CUTS

[75] Inventor: Olivier Rouy, Aix-en-Provence, France

[73] Assignee: SGS-Thomson Microelectronics, S.A., Gentilly Cedex, France

[21] Appl. No.: 100,867

[22] Filed: Aug. 2, 1993

[30] Foreign Application Priority Data

Jul. 31, 1992 [FR] France .................................. 92 09566

[51] Int. Cl.⁶ ............................... G06F 1/28; G06F 1/30; H02H 9/00
[52] U.S. Cl. .................... 361/18; 361/56; 361/58; 361/92; 364/273.4; 364/346.6
[58] Field of Search ..................... 361/18, 56, 58, 361/86, 88, 92, 100, 101; 307/360, 442, 443, 465, 468, 469, 473, 475; 340/663; 395/750, 425; 364/246.6, DIG. 1, 273.4; 324/550, 537, 522, 416; 327/74; 326/21, 37, 44, 47, 49, 56, 59, 63

[56] References Cited

U.S. PATENT DOCUMENTS 3,624,617  11/1971  Putterman ............................... 340/663
4,096,560  6/1978   Footh ........................................ 361/90
4,975,883  12/1990  Baker et al. ............................. 365/286

FOREIGN PATENT DOCUMENTS 019222  11/1980  European Pat. Off. ......... H02H 7/20
264095  1/1989   Germany ........................... H02J 9/00

Primary Examiner—A. D. Pellinen
Assistant Examiner—Ronald W. Leja
Attorney, Agent, or Firm—Robert Groover; Betty Formby

[57] ABSTRACT

A circuit for protecting nonvolatile memories against loss of Vcc while Vpp is high. An NMOS gated by Vcc is connected, in series with a load element, between Vpp and ground. The node between the NMOS and the load element gates a PMOS which is interposed between Vpp and the memory. Thus when Vcc fails while Vpp is high, the NMOS will turn off, and the load element will pull up the gate of the PMOS to turn it off, interrupting the Vpp supply. This prevents spurious write or erase operations under these circumstances. The circuit can be designed to trigger at threshold voltages as low as $V_{TN}$, and is thus particularly advantageous for operation with specified Vcc values of 3 Volts or less.

40 Claims, 2 Drawing Sheets

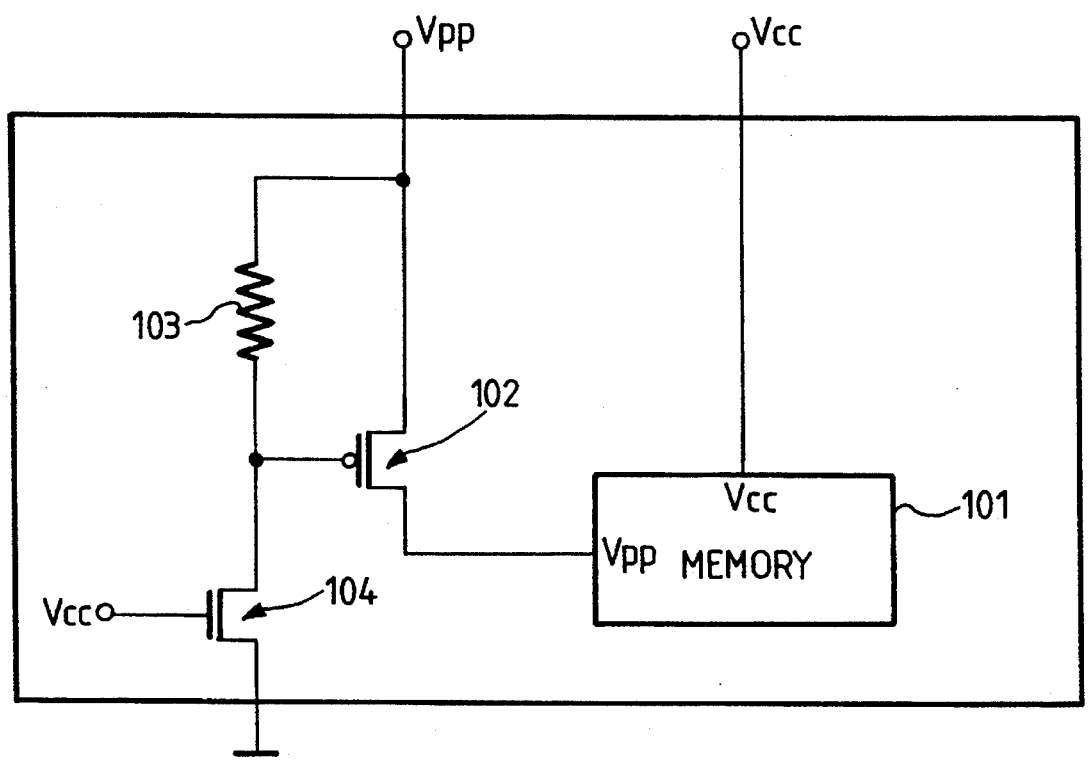
FIG_1

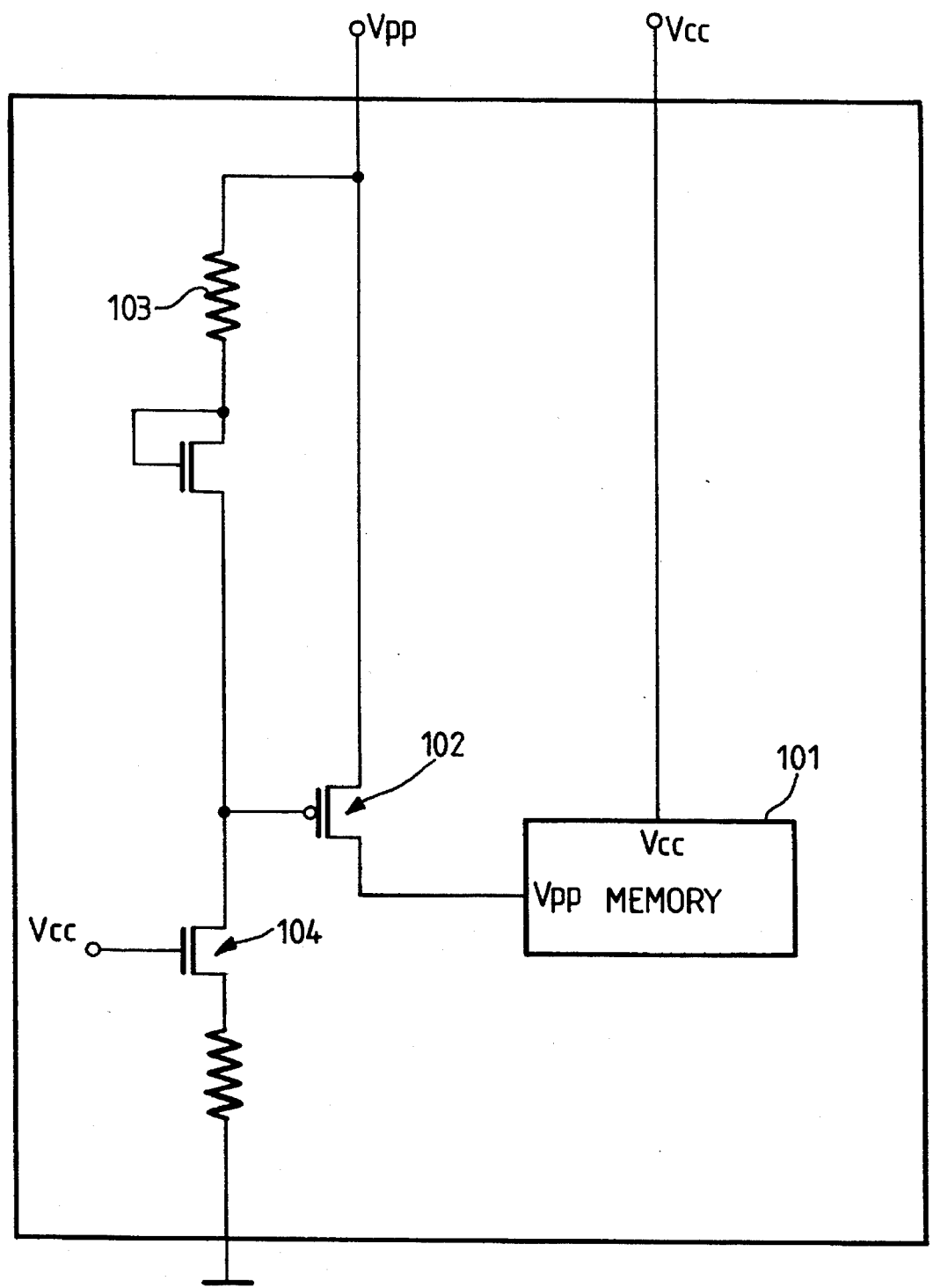
FIG_2

5,473,496

DEVICE FOR THE PROTECTION OF AN INTEGRATED CIRCUIT AGAINST POWER SUPPLY CUTS

CROSS-REFERENCE TO RELATED APPLICATION

This application claims priority from French App'n 92-09566, filed Jul. 31, 1992, which is hereby incorporated by reference.

BACKGROUND AND SUMMARY OF THE INVENTION

The present invention relates to devices that can be used to protect integrated circuits against unwanted or unexpected cuts in the power supply so as to prevent data elements from being memorized or erased randomly. The invention can be applied to memories of the electrically programmable type, especially memories of the electrically erasable type.

It is generally known that in integrated circuits, more especially in memories, including programmable memories, a normal supply voltage is used. This supply voltage, conventionally called Vcc, powers the logic circuits of the integrated circuit (and the read circuits of an integrated circuit memory), and is maintained during normal use of the circuit. In the case of programmable memories, another appreciably higher voltage is also used (typically 10–20 Volts). This higher voltage is needed to cause the migration of charges through an oxide layer which is used to program individual cells. This second voltage, commonly called Vpp, is also used in the case of programmable memories which, in addition, are electrically erasable.

It is known that, according to the values currently encountered, the programming of an entire EEPROM memory typically lasts about one second and its erasure about 5 seconds. During this period, any unexpected failure of the first supply voltage Vcc may cause serious problems unless the second voltage Vpp is cut off before the logic has become defective because of the gradual drop in the voltage Vcc. If the logic becomes defective while Vpp is still present, the Vpp voltage may be seen by memory cells which were not intended to be written or erased.

A cut in the power supply to a logic system such as a microprocessor, or a memory during a period without program or erasure operations, generally requires only a re-initialization of the system when the power supply is restored. However, if erroneous data elements have been involuntarily programmed or if accurate data elements have been partially erased, then the reinitialization will not correct these errors, and the system will therefore operate with data elements that are at least partially false. This may lead to catastrophic results. It is possible to conceive of a situation where, in a financial application for example, major sums of money may be credited or debited in the memory of a "chip" card for example when no real transaction should have been recorded.

The approach adopted until now has consisted in making a downline decoupling of the points of access to the memory cells. This is sometimes accomplished by means of the internal logic of the memory when this logic is activated upon the detection of the drop in voltage Vcc, by a monitor circuit. However, the monitor circuit may itself be prevented from operating properly due to the loss of Vcc.

To overcome this drawback, the invention proposes a device for the protection of an integrated circuit against power supply cuts. This integrated circuit is designed to be supplied with at least one normal supply voltage Vcc and with a programming and/or erasure voltage Vpp. The device comprises a means for cut-off inserted in series between the source of the voltage Vpp and the supply input of the integrated circuit corresponding to this source. Also, it contains means to activate these cut-off devices which are connected to the source of the voltage Vcc. This cut-off is activated when the value of the voltage Vcc drops below a certain threshold and before this drop reaches a value starting from which the logic operation of the integrated circuit becomes random.

BRIEF DESCRIPTION OF THE DRAWING

The present invention will be described with reference to the accompanying drawings, which show important sample embodiments of the invention and which are incorporated in the specification hereof by reference, wherein:

FIG. 1 shows a schematic diagram of a device according to the invention.

FIG. 2 shows a variation of the device of FIG. 1.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

In FIG. 1, the integrated circuit 101 is supplied with the normal operating voltage Vcc. It also contains another supply input designed to receive the programming and/or erasure voltage Vpp.

According to the invention, this second supply input is supplied from the source of supply voltage Vpp by means of a first P type MOS transistor 102 which is connected in series between this voltage source and the corresponding input Vpp of the circuit 101. The gate of this transistor 102 is connected to the voltage source Vpp by means of a bias resistor 103. The gate is biased by a second MOS transistor 104. This transistor is connected from the gate of transistor 102 to ground and is of the N type.

In order that this second transistor 104 may be conductive and, in order to bring the gate of the transistor 102 to a low potential, enabling this transistor 102 to be turned on, the gate of the second transistor 104 is itself connected to the source of voltage Vcc.

When Vcc and Vpp have their normal value, the transistor 104 is conductive, and therefore makes the transistor 102 conductive, to enable the supply of the integrated circuit from the source of voltage Vpp.

When the voltage Vcc drops, during a power supply failure for example, the transistor 104 no longer conducts. This makes the potential at the gate of the transistor 102 rise to a value close to Vpp, and turns off this transistor 102. This then cuts off the supply voltage Vpp from the circuit 101.

The circuit of the invention reacts swiftly to a rise in the supply voltage whilst the logic does activate as quickly. However, when voltage levels descend, the logic of the circuit 101 is capable of operating without errors until a low level of Vcc is reached. When voltages drop below this low-level, the circuit of the invention takes over in cutting off the supply of Vpp. This cut-off occurs before the voltage Vcc has dropped excessively, otherwise an excessive drop could result in the malfunctioning of the circuit 101.

In a variation of this circuit shown in FIG. 2, a diode-connected transistor is connected between the detection node and the load element and an additional load element is connected between the detection node and ground.

This invention can easily be fulfilled with MOS transistors of the usual, commercially available type. The dimensions of these transistors can be used to manufacture a circuit that is specialized for this use or even for a circuit integrated into the internal circuits of the integrated circuits 101.

One sample preferred embodiment incorporates transistors 102 and 104 in integrated form with a Vt of about 0.8 V each. This configuration works well when used with, for example, 1 megabit flash EEPROM's of the type manufactured by the applicant.

It should be noted that resistor 103 is a load element. It need not be linear in all cases. It could include diodes, self biased FET's as diodes, linear resistors or any electronic element that provides a load.

In another embodiment transistors 102, 104 and resistor 103 are manufactured from discrete components. This works well for VI-Power MOS devices of the type manufactured by SGS-Thomson. This allows the invention to be realized utilizing multiple voltage supply sources for that of Vcc and Vpp.

The resistance of the resistor 103 should be relatively high so that, when the transistor 104 is on, the potential of the gate of the transistor 102 is low to transmit Vpp. The response time of 102 is of the order of one nanosecond because all that is necessary is to charge or discharge the drain-substrate capacitance of the transistor 104 and the gate-substrate capacitance of the transistor 102. The cut-off threshold is determined partly by the value of the resistance.

Furthermore, an assembly such as this works well for relatively low supply voltages Vcc, possibly having values of up to one or two volts. It is known that these voltages are increasingly being considered for power supplies to integrated circuits, for reasons of operating time in battery-powered portable instruments.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

For example, the threshold value of Vcc, in the presently preferred embodiment, is approximately VTN above ground; but alternatively, of course, the circuit can readily be modified to trip at a Vcc value which is higher than VTN. This can be done, for example, by including an additional load element (resistor and/or diode) between the source of the NMOS transistor and ground.

For another example, it will be readily recognized that the simplicity of the disclosed circuit could be modified while still preserving the disclosed principles of operation. For one example, the gate of the N-channel transistor can optionally be connected to Vcc through a voltage-divider network rather than directly; and many other such modifications are also possible.

While the disclosed inventions are particularly advantageous in nonvolatile memories (where the high programming voltage Vpp is needed), these inventions can also (alternatively and less preferably) be applied to other types of integrated circuits which also use multiple supply voltages.

For another example: To reduce current demand in an integrated circuit implementation, while reducing the area needed for resistor 103, additional load elements (e.g. PMOS depletion device) can be added between the gate of PMOS 102 and the drain of NMOS 102. In a further alternative, the resistor 103 can even be entirely replaced by a nonlinear load element.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A circuit, comprising:

an integrated circuit having connections for a first supply voltage, a second positive supply voltage, and a third positive supply voltage which is higher than said second positive supply voltage;

a load element connected to said third supply voltage;

an N-channel field-effect transistor connected to be controlled by said second supply voltage; said load element and said N-channel field-effect transistor being operatively connected in series between said first and third supply voltages; and a P-channel field-effect transistor connected between said third supply voltage and a corresponding one of said connections of said integrated circuit, and connected to be controlled by a node between said load element and said N-channel field-effect transistor;

whereby, when said second supply voltage falls below the threshold voltage of said N-channel field-effect transistor, said N-channel field-effect transistor turns off and ceases to pull down the down the potential of said node, and thereby permits said P-channel field-effect transistor to turn off and disconnect said integrated circuit from said third supply voltage.

2. The circuit of claim 1, wherein said load element consists of a resistor.

3. The circuit of claim 1, wherein said load element has a linear relationship between current and voltage.

4. The circuit of claim 1, further comprising at least one diode-connected transistor connected between said detection node and said load element.

5. The circuit of claim 1, further comprising at least one additional load element connected between said detection node and said first supply voltage.

6. The circuit of claim 1, wherein said load element, said N-channel field-effect transistor, and said P-channel field-effect transistor are provided by discrete components.

7. The circuit of claim 1, wherein one or more of said load element, said N-channel field-effect transistor, and said P-channel field-effect transistor are integrated with said integrated circuit.

8. The circuit of claim 1, wherein said integrated circuit is a non-volatile memory.

9. The circuit of claim 1, wherein said integrated circuit is directly connected to said first and second supply voltages.

10. The circuit of claim 1, wherein said integrated circuit is an EEPROM.

11. A circuit comprising:

circuit element directly connected to receive a first supply voltage and a second supply voltage which is higher than said first supply voltage, and also having a connection for receiving a third supply voltage which is higher than said second supply voltage;

a load element connected between said third supply voltage and a detection node, an N-channel field-effect transistor connected between said detection node and said first supply voltage, and having a gate operatively connected to be controlled by a voltage which is dependent on said second supply voltage; and a P-channel field-effect transistor connected between said third supply voltage and said third supply voltage connection of said circuit element, and having a gate operatively connected to said detection node.

12. The circuit of claim 11, wherein said load element consists of a resistor.

13. The circuit of claim 11, further comprising at least one diode-connected transistor connected between said detection node and said load element.

14. The circuit of claim 11, further comprising at least one additional load element connected between said detection node and said first supply voltage.

15. The circuit of claim 11, wherein said load element, said N-channel field-effect transistor, and said P-channel field-effect transistor are provided by discrete components.

16. The circuit of claim 11, wherein one or more of said load element, said N-channel field-effect transistor, and said P-channel field-effect transistor are integrated with said circuit element.

17. The circuit of claim 11, wherein said circuit element is a non-volatile memory.

18. The circuit of claim 11, wherein said circuit element is directly connected to said first and second supply voltages.

19. The circuit of claim 11, wherein said circuit element is an EEPROM.

20. A circuit, comprising:

a circuit element having connections for a first supply voltage, a second positive supply voltage, and a third positive supply voltage which is higher than said second positive supply voltage;

a load element connected to said third supply voltage;

a first switching element connected to be controlled by said second supply voltage; said load element and said first switching element being operatively connected in series between said first and third supply voltages; and a second switching element connected between said third supply voltage and a corresponding one of said connections of said circuit element, and connected to be controlled by a node between said load element and said first switching element;

whereby when said second supply voltage fails, said first switching element turns off, and ceases to drive current through said load element, and thereby permits said second switching element to turn off and disconnect said circuit element from said third supply voltage.

21. The circuit of claim 20, wherein said first switching element consists of an N-channel field-effect transistor, and said second switching element consists of a P-channel field-effect transistor.

22. The circuit of claim 20, wherein said load element consists of a resistor.

23. The circuit of claim 20, wherein said load element has a linear relationship between current and voltage.

24. The circuit of claim 20, further comprising at least one diode-connected transistor connected between said node and said load element.

25. The circuit of claim 20, further comprising at least one additional load element connected between said node and said first supply voltage.

26. The circuit of claim 20, wherein said load element, said N-channel field-effect transistor, and said P-channel field-effect transistor are provided by discrete components.

27. The circuit of claim 20, wherein one or more of said load element, said N-channel field-effect transistor, and said P-channel field-effect transistor are integrated with said circuit element.

28. The circuit of claim 20, wherein said circuit element is a non-volatile memory.

29. The circuit of claim 20, wherein said circuit element is directly connected to said first and second supply voltages.

30. The circuit of claim 20, wherein said circuit element is an EEPROM.

31. An integrated circuit, comprising:

connections for receiving a first supply voltage, a second supply voltage which is higher than said first supply voltage, and a third supply voltage which is higher than said second supply voltage;

a circuit block directly connected to receive said first and second supply voltages, and also having a connection for receiving said third supply voltage;

a load element connected between said third supply voltage and a detection node, an N-channel field-effect transistor connected between said detection node and said first supply voltage, and having a gate operatively connected to be controlled by a voltage which is dependent on said second supply voltage; and a P-channel field-effect transistor connected between said third supply voltage and said corresponding connection of said circuit block, and having a gate operatively connected to said detection node.

32. The circuit of claim 31, wherein said load element consists of a resistor.

33. The circuit of claim 31, further comprising at least one diode-connected transistor connected between said detection node and said load element.

34. The circuit of claim 31, further comprising at least one additional load element connected between said detection node and said first supply voltage.

35. The circuit of claim 31, wherein said circuit block is an EEPROM memory array, and wherein said third supply voltage provides a Vpp supply thereto.

36. A device for the protection of an integrated circuit against power supply cuts, said device being designed to be supplied with at least one normal supply voltage Vcc and with a programming and/or erasure voltage Vpp, said device comprising cut-off means inserted in series between the source of the voltage Vpp and the supply input of the integrated circuit corresponding to this source, and means to activate said cut-off means, connected to the source of the voltage Vcc to activate said cut-off means when the value of the voltage Vcc drops below a certain threshold, said threshold value being determined to activate said cut-off means before said voltage Vcc reaches a value, below which the logic operation of the integrated circuit becomes random.

37. A device according to claim 36, wherein said cut-off means comprises a first P type MOS transistor inserted in series between the source of the voltage Vpp and the corresponding input of the integrated circuit, and a bias resistor connecting the source of the voltage Vpp to the gate of this first transistor, and said means to activate comprises a second N type MOS transistor connected in series between the gate of the first transistor and ground, and means for connecting the gate of this second transistor to the source of the voltage Vcc.

38. A device according to claim 36, wherein the integrated circuit is an electrically erasable and programmable memory.

39. A device according to claim 37, wherein the integrated circuit is an electrically erasable and programmable memory.

40. A method for operating an integrated circuit memory which requires three different supply voltages, comprising the steps of:

providing a load element and a first switching element connected in series between the highest and lowest of said supply voltages, and connecting an intermediate supply voltage to control said first switching element;

and, passing the highest of said supply voltages through a second switch which is connected to automatically turn off whenever said intermediate supply voltage fails and causes said first switching element to interrupt current through said load element, thereby automatically interrupting said highest of said supply voltages at a point before it enters said memory.

* * * * *

UNITED STATES PATENT AND TRADEMARK OFFICE
CERTIFICATE OF CORRECTION

PATENT NO. : 5,473,496
DATED : December 5, 1995
INVENTOR(S) : Rouy

It is certified that error appears in the above-indentified patent and that said Letters Patent is hereby corrected as shown below:

In column 4, line 46, please change "down the down" to --down--.

Signed and Sealed this

Second Day of July, 1996

Attest:

BRUCE LEHMAN

Attesting Officer

Commissioner of Patents and Trademarks